US008493126B2

(12) United States Patent
Sankaranarayanan et al.

(10) Patent No.: US 8,493,126 B2
(45) Date of Patent: Jul. 23, 2013

(54) WIDEBAND BALUN HAVING A SINGLE PRIMARY AND MULTIPLE SECONDARIES

(75) Inventors: Janakiram G. Sankaranarayanan, San Diego, CA (US); Bhushan S. Asuri, San Diego, CA (US); Vinod V. Panikkath, San Diego, CA (US); Hongyan Yan, San Diego, CA (US); Himanshu Khatri, San Diego, CA (US); Maulin Bhagat, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 37 days.

(21) Appl. No.: 12/836,779

(22) Filed: Jul. 15, 2010

(65) Prior Publication Data
US 2012/0013387 A1    Jan. 19, 2012

(51) Int. Cl.
*G06G 7/12* (2006.01)
(52) U.S. Cl.
USPC ............................. 327/355; 455/323; 327/356
(58) Field of Classification Search
USPC ............................ 327/355–361; 455/323, 326
See application file for complete search history.

(56) References Cited

U.S. PATENT DOCUMENTS

| 4,225,823 | A | * | 9/1980 | Ogita | 455/226.1 |
| 5,742,897 | A | * | 4/1998 | Plowdrey et al. | 455/142 |
| 6,009,318 | A | * | 12/1999 | Freed | 455/326 |
| 6,705,441 | B1 | * | 3/2004 | Boys et al. | 191/10 |
| 7,746,174 | B2 | * | 6/2010 | Yang et al. | 330/295 |
| 2009/0128254 | A1 | | 5/2009 | Goi et al. | |
| 2009/0273411 | A1 | | 11/2009 | Roufoogaran | |
| 2010/0167667 | A1 | | 7/2010 | Laporte et al. | |

FOREIGN PATENT DOCUMENTS

| EP | 2346165 A1 | 7/2011 |
| JP | 02000152615 A * | 5/2000 |
| WO | WO2010055725 A1 | 5/2010 |

OTHER PUBLICATIONS

International Search Report and Written Opinion—PCT/US2011/044265—ISA/EPO—Nov. 3, 2011.

* cited by examiner

*Primary Examiner* — Dinh T. Le
(74) *Attorney, Agent, or Firm* — Kenyon S. Jenckes

(57) ABSTRACT

An RF transmitter capable of transmitting over a wide range of frequencies includes a mixer, a wideband high-Q balun, a first driver amplifier and a second driver amplifier. The balun has a single primary winding and two secondary windings. A differential output of the mixer is coupled to the primary winding. A first of the two secondary windings is coupled to drive the first driver amplifier. A second of the two secondary windings is coupled to drive the second driver amplifier. One driver amplifier is used when transmitting at lower frequencies whereas the other driver amplifier is used when transmitting at higher frequencies. By appropriate sizing of the inductances of the secondary windings and by switching out one of the secondary windings at certain times, the balun is tunable to operate over the wide frequency range while having a high quality factor Q, thereby facilitating reduced power consumption while simultaneously meeting performance requirements.

35 Claims, 9 Drawing Sheets

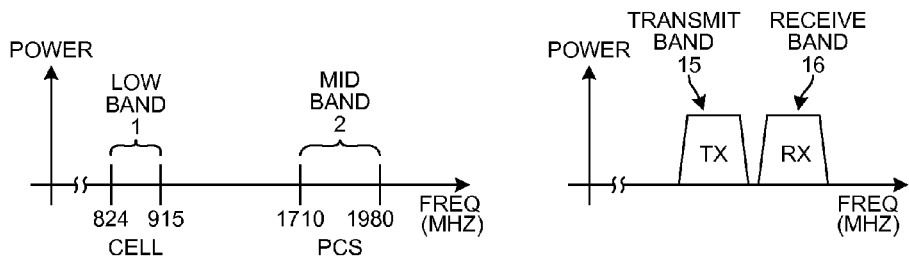
(PRIOR ART)
FIG. 1
(PRIOR ART)
FIG. 3
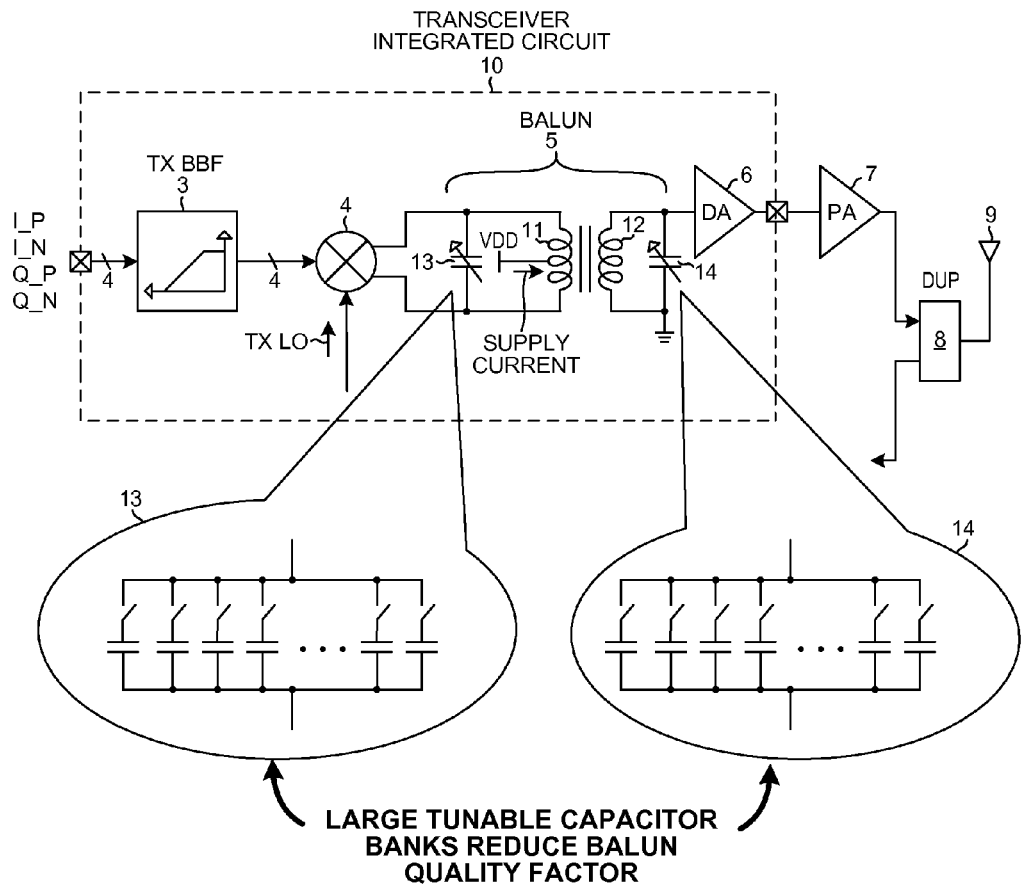
(PRIOR ART)
FIG. 2

SINGLE PRIMARY DUAL SECONDARY BALUN

ACTIVE MIXER

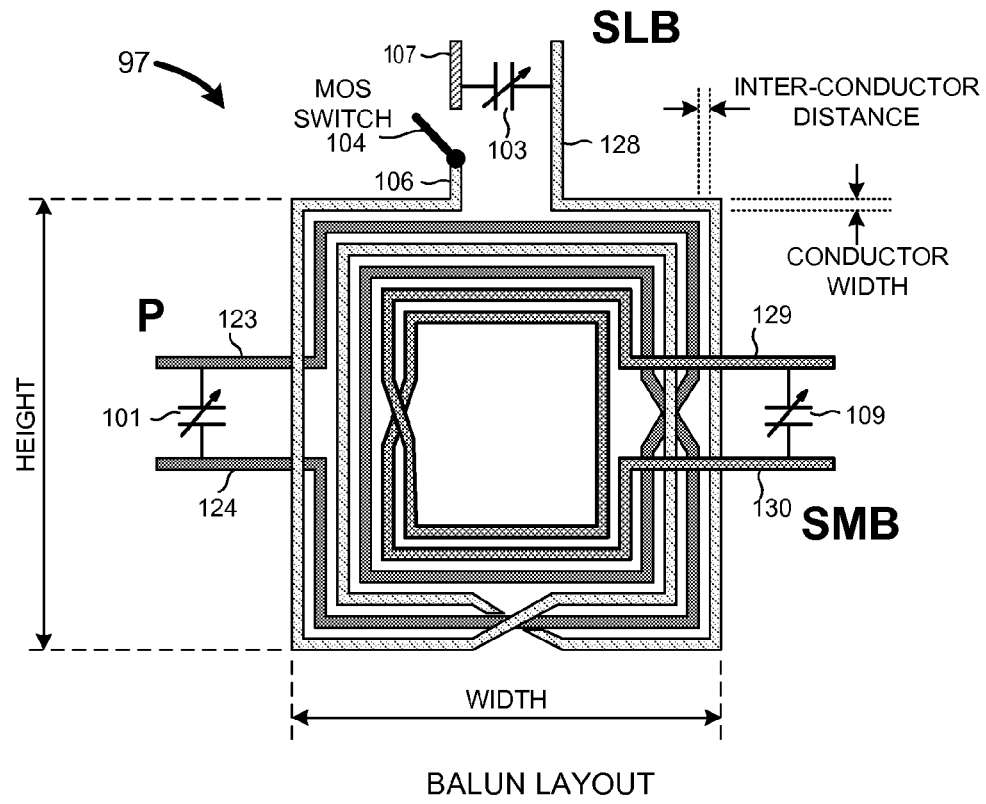

BALUN LAYOUT

FIG. 10

| PRIMARY CAPACITOR (RTMOM) | 0-3.2pF |
|---|---|
| PRIMARY INDUCTOR | 1.8nH |
| SECONDARY LB CAPACITOR (RTMOM) | 0-9.0pF |
| SECONDARY LB INDUCTOR | 3.9nH |
| SECONDARY MB CAPACITOR (RTMOM) | 0-3.2pF |
| SECONDARY MB INDUCTOR | 1.4nH |
| INTER-CONDUCTOR DISTANCE | 2 microns |
| P CONDUCTOR WIDTH | 10 microns |
| SLB CONDUCTOR WIDTH | 8 microns |
| SMB CONDUCTOR WIDTH | 11 microns |
| CONDUCTOR THICKNESS | 3.4 microns |
| WIDTH | 360 microns |
| HEIGHT | 360 microns |
| MOS SWITCH (W/L) | 144 microns/60 nm |

FIG. 11

CURRENT INTO MIXER/BALUN CIRCUIT WHEN 1.0 mW OF
SIGNAL POWER IS SUPPLIED TO DRIVER AMPLIFIER

| BALUN DIGITAL CONTROL | | | | FREQUENCY RANGE (MHZ) | MIXER/BALUN SUPPLY CURRENT (@1.3V) |
| --- | --- | --- | --- | --- | --- |
| P[4:0] | SLB[5:0] | SMB[6:0] | SW ON/OFF | | |
| 11111 (31) | 110000 (48) | 0000000 (00) | ON=1 | 824-849 | ~20mA |
| 11111 (31) | 101011 (43) | 0000000 (00) | ON=1 | 849-880 | ~20mA |
| 11111 (31) | 100110 (38) | 0000000 (00) | ON=1 | 880-915 | ~20mA |
| 01111 (15) | 000000 (00) | 0100110 (38) | OFF=1 | 1710-1785 | ~10mA |
| 01111 (15) | 000000 (00) | 0011110 (30) | OFF=1 | 1785-1850 | ~10mA |
| 01111 (15) | 000000 (00) | 0010100 (20) | OFF=1 | 1850-1980 | ~10mA |

**OVER THE ENTIRE 824-1980 MHZ FREQUENCY RANGE THE MIXER/BALUN CIRCUIT CONSUMES
LESS THAN 27 mW WHILE OUTPUTTING AT LEAST 1.0 mW OF SIGNAL POWER TO THE
APPROPRIATE DRIVER AMPLIFIER WHILE THE BALUN MAINTAINS A Q OF AT LEAST 6.0**

MIXER/BALUN CIRCUIT OPERATION

FIG. 12

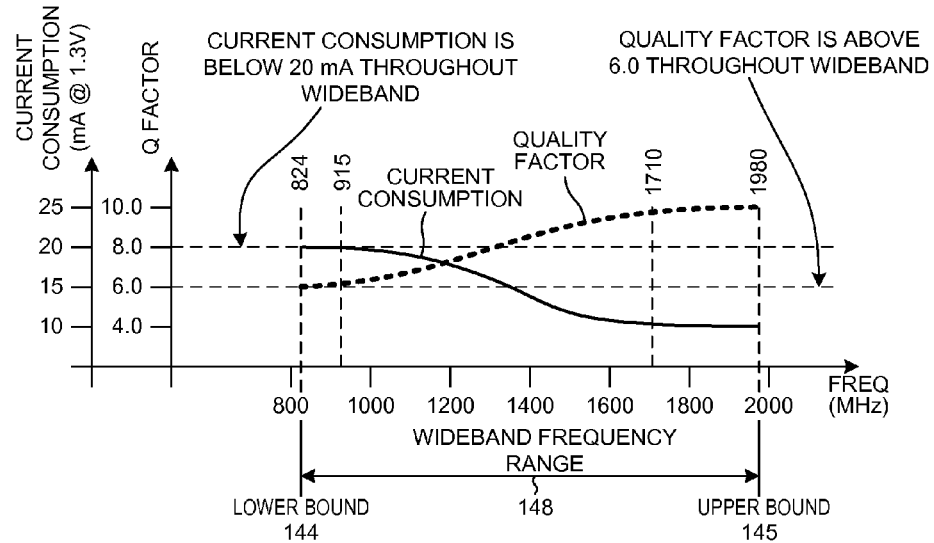

MIXER/BALUN CIRCUIT OPERATION

FIG. 13

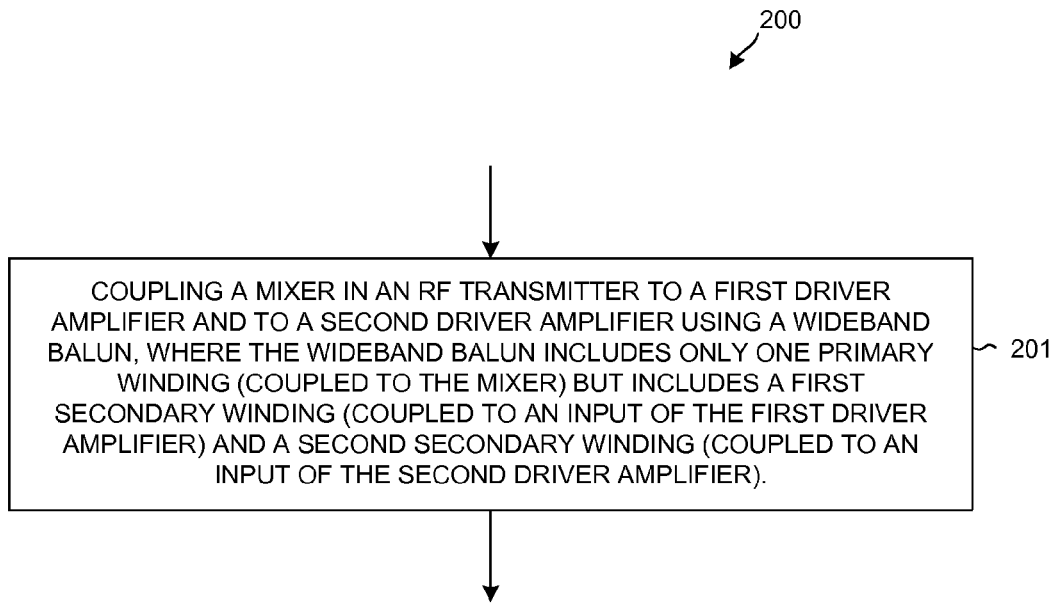

WIDEBAND BALUN HAVING A SINGLE PRIMARY AND MULTIPLE SECONDARIES

BACKGROUND INFORMATION

1. Technical Field

The present disclosure relates to wideband transmitters, and more particularly to mixers and baluns used in wideband transmitters.

2. Background Information

Many types of RF (Radio Frequency) transceivers, including cellular telephone transceivers such as in multi-band cellular telephones, must work over a wide frequency range. In one example, a cellular telephone may be required to operate in a first frequency band referred to here as a "cell band" or a "low band". The same cellular telephone may also be required to operate in a second frequency band referred to here as a "PCS band" or a "mid band". FIG. 1 (Prior Art) is a diagram that shows frequency along the horizontal axis. Low band 1 in this example extends from 824 MHz to 915 MHz and mid band 2 extends from 1710 MHz to 1980 MHz.

FIG. 2 (Prior Art) is a circuit diagram that illustrates a first way that a transmitter of a multi-band cellular telephone transceiver can be made to operate over the wide frequency range of FIG. 1. The transmitter includes a transmit baseband filter 3, a mixer 4, a balun 5, a driver amplifier 6, a power amplifier 7, a duplexer 8, and an antenna 9. The dashed box 10 indicates the portion of the transmitter that is realized on an RF transceiver integrated circuit. Balun 5 includes one primary winding 11 and one secondary winding 12. A first programmable capacitor 13 is coupled in parallel with the primary winding and a second programmable capacitor 14 is coupled in parallel with the secondary winding. To make the transmitter operable over the wide frequency range, the capacitors 13 and 14 are made to be large and tunable capacitors. Such a large and tunable capacitor typically involves banks of capacitors and associated transistor switches. The transistors are used to switch the capacitors in and out of the overall structure to increase or decrease the overall capacitance. Unfortunately, making the first and second capacitors large and programmable in this way reduces the quality factor (the "Q") of the balun. Due in part to this low quality factor, the transceiver when transmitting in the low band may emit an undesirable amount of receive band noise in a nearby receive band even though the transmitter is tuned to transmit in a transmit band. The transmit and receive bands are typically quite narrow and are located quite close to one another within the wider low band or the wider mid band.

FIG. 3 (Prior Art) illustrates a transmit band 15 and a receive band 16 that may, for example, exist side by side in the low band 1 of FIG. 1. When the circuit of FIG. 2 is used to transmit in transmit band 15, an unwanted amount of energy is also transmitted into receive band 16 due to the low Q of balun 5 of FIG. 2.

FIG. 4 (Prior Art) is a diagram of a second way that a transmitter of a transceiver integrated circuit 32 of a multi-band cellular telephone can be made to operate over a wide frequency range such as the wide frequency range illustrated in FIG. 1. Because the balun tuning range is a function of both inductance and capacitance, if the tuning range of the balun capacitances is limited as in FIG. 2 due to quality factor issues then an amount of inductance tuning is provided by providing two higher-Q baluns having different winding inductances. Accordingly, one transmit baseband filter 17 is provided, but the remainder of the transmitter is duplicated. A low band circuit path 18 involves mixer 19, balun 20, driver amplifier 21, power amplifier 22, and a duplexer 23. This low band circuit path 18 is optimized for operation in the low band of FIG. 1. A mid band circuit path 24 involves mixer 25, balun 26, driver amplifier 27, power amplifier 28, and a duplexer 29. This mid band circuit path is optimized for operation in the mid band of FIG. 1. The two mixers 19 and 25 are both driven by the same transmit local oscillator signal TX LO. An antenna switch 30 couples the appropriate one of the two circuit paths to antenna 31. If the transmitter is to transmit in the low band, then signal EN DA1 is asserted to enable driver amplifier 21 and signal EN DA2 is not asserted such that driver amplifier 27 is disabled. Conversely, if the transmitter is to transmit in the mid band, then signal EN DA2 is asserted to enable driver amplifier 27 and signal EN DA1 is not asserted such that driver amplifier 21 is disabled.

The two-path transmitter circuit of FIG. 4 does not have the low Q balun problem of the transmitter circuit of FIG. 2, but the two-path transmitter circuit of FIG. 4 is undesirably large as implemented due to the redundant circuitry. The two-path transmitter also consumes an undesirably large amount of power. Interconnections between the divider circuitry that generates the transmit local oscillator signal TX LO and the mixers can be long when there are two mixers 19 and 25. Such long interconnections often result in increased current consumption.

SUMMARY

An RF transmitter capable of transmitting over a wide range of frequencies includes a mixer, a wideband high-Q balun, a first driver amplifier and a second driver amplifier. The wideband high-Q balun has a single primary winding and two secondary windings. A differential output of the mixer is coupled to the primary winding. A first of the two secondary windings is coupled to drive the first driver amplifier in single-ended fashion. A second of the two secondary windings is coupled to drive the second driver amplifier in single-ended fashion. One driver amplifier is used when transmitting at lower frequencies whereas the other driver amplifier is used when transmitting at higher frequencies. By appropriate sizing of the inductances of the secondary windings and by switching out one of the secondary windings at certain times, the balun is tunable to operate over the wide range of frequencies while having a high quality factor Q, thereby facilitating reduced power consumption in the mixer/balun circuit while simultaneously meeting performance requirements.

In one specific example, the mixer/balun circuit is "wideband" in the sense that it is operable over a frequency range that has an upper bound at an upper frequency and that has a lower bound at a lower frequency where the upper frequency is at least twice the lower frequency. The balun of the mixer/balun circuit has a quality factor (Q) of at least 6.0 over this entire wideband frequency range. The mixer/balun circuit provides at least one milliwatt of signal power to the appropriate driver amplifier while consuming no more than twenty-seven milliwatts, and performs this way for any frequency in the wideband frequency range.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 1 (Prior Art) is a diagram that shows a wideband frequency range that extends from a lower bound of a low band to an upper bound of a mid band.

FIG. 2 (Prior Art) is circuit diagram that illustrates a first way that a transmitter can be made to operate over the wideband frequency range of FIG. 1.

FIG. 3 (Prior Art) is a diagram that shows a transmit band and a receive band.

FIG. 10 is a top-down diagram of a layout of the balun of FIG. 8.

FIG. 11 is a table that that sets forth various parameters of the mixer/balun circuit of FIG. 8 including the inductances of the three windings and including the tuning ranges of the three programmable variable capacitors.

FIG. 12 is a table that sets forth how the balun digital control values P[4:0], SLB[5:0], SMB[6:0], and SW ON/OFF are set depending on the frequency range in which the transmitter is operating.

FIG. 13 is a graph that illustrates how current consumption of the mixer/balun circuit and how the quality factor of the balun vary as the operating frequency of the mixer/balun circuit varies throughout the wideband frequency range from 824 MHz to 1980 MHz.

FIG. 14 is a simplified flowchart of a method 200 in accordance with one novel aspect.

FIG. 15 is a simplified flowchart of a method 300 in accordance with another novel aspect.

DETAILED DESCRIPTION

Figure 5:
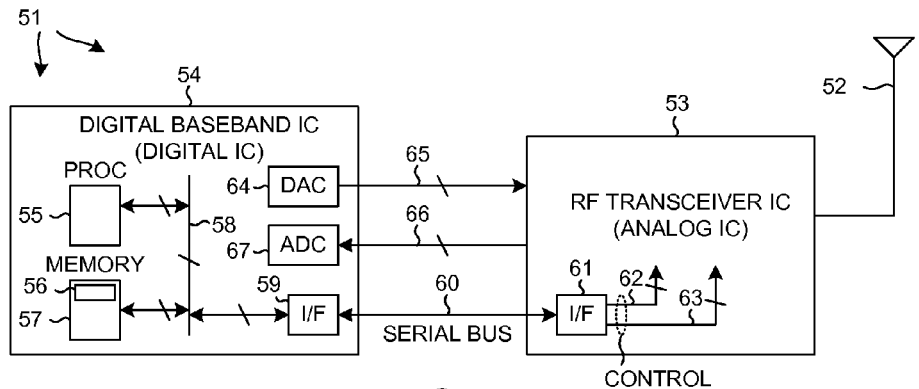
FIG. 5 is a diagram of a mobile communication device that includes a mixer/balun circuit in accordance with one novel aspect.

FIG. 5 is a diagram of a mobile communication device 51 that includes a mixer/balun circuit in accordance with one novel aspect. In this example, mobile communication device 51 is a multi-band cellular telephone handset. Device 51 includes (among other parts not illustrated) an antenna 52 usable for receiving and transmitting cellular telephone communications, an RF (Radio Frequency) transceiver integrated circuit 53, and a digital baseband processor integrated circuit 54. In some examples, the transceiver circuitry and the digital baseband circuitry are implemented on the same integrated circuit, but a two integrated circuit implementation is set forth here for illustration purposes.

Digital baseband integrated circuit 54 includes a processor 55 that executes a program 56 of processor-executable instructions. Program 56 is stored in a processor-readable medium 57 that in this case is a semiconductor memory. Processor 55 accesses memory 57 via local bus 58. Processor 55 interacts with and controls the RF transceiver integrated circuit 53 by sending control information to integrated circuit 53 via serial bus interface 59, serial bus 60, serial bus interface 61, and groups of control conductors 62 and 63. Information to be transmitted is converted into digital form on digital baseband processor integrated circuit 54 by a Digital-to-Analog Converter (DAC) 64 and is communicated across conductors 65 to the transmitter portion of transceiver integrated circuit 53. Data received by the receiver portion of transceiver integrated circuit 53 is communicated in the opposite direction across conductors 66 from RF transceiver integrated circuit 53 to digital baseband processor integrated circuit 54 and is converted into digital form by an Analog-to-Digital Converter (ADC) 67.

Figure 6:
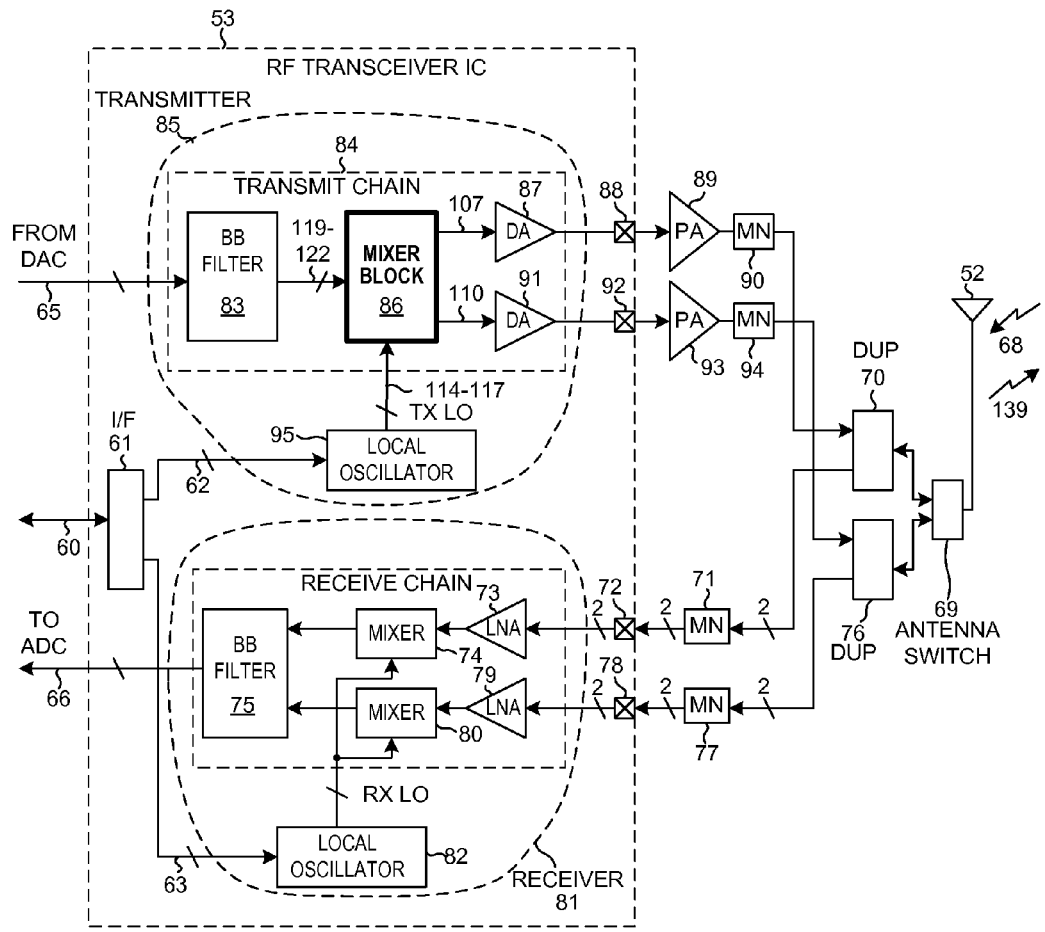
FIG. 6 is a more detailed diagram of the transceiver and antenna parts of the mobile communication device of FIG. 5.

FIG. 6 is a more detailed diagram of the transceiver and antenna parts of the cellular telephone of FIG. 5. In one very simplified explanation of the operation of the cellular telephone, if the cellular telephone of FIG. 5 is being used to receive information as part of a cellular telephone call, then an incoming transmission 68 is received on antenna 52. The incoming signal passes through an antenna switch 69, and then passes through one of two receive paths of a receiver portion 81 of the RF transceiver integrated circuit 53. In one path, the incoming signal passes through duplexer 70, a matching network 71, terminals 72, a Low Noise Amplifier (LNA) 73, a mixer 74, a baseband filter 75, and conductors 66 to the ADC 67 within digital baseband processor integrated circuit 54. In another path, the incoming signal passes through antenna switch 69, duplexer 76, matching network 77, terminals 78, LNA 79, mixer 80, baseband filter 75, and conductors 66 to the ADC 67 of the digital baseband processor integrated circuit 54. A local oscillator 82 (also referred to as a frequency synthesizer) supplies a receive local oscillator signal RX LO to the mixers 74 and 80. How the receiver downconverts is controlled by changing the frequency of the local oscillator signal RX LO and by selecting the appropriate receive path. One of the receive paths is used to receive signals in a first frequency band whereas the other of the receive paths is used to receive signals in a second frequency band.

If, on the other hand, cellular telephone 51 is being used to transmit information as part of a cellular telephone call, then the information to be transmitted is converted into analog form by DAC 64 in digital baseband processor integrated circuit 54. The analog information is supplied to a baseband filter 83 of a transmit chain 84 portion of a transmitter portion 85 of the RF transceiver integrated circuit 53. After filtering by the baseband filter, the signal is upconverted in frequency by a novel mixer block 86 as explained in further detail below. The upconverted signal passes through one of two paths to antenna 52. In a first path, the signal passes through driver amplifier 87, terminal 88, power amplifier 89, matching network 90, duplexer 70, antenna switch 69, and to antenna 52 for transmission as transmission 139. In a second path, the signal passes through driver amplifier 91, terminal 92, power amplifier 93, matching network 94, duplexer 76, antenna switch 69, and to antenna 52 for transmission as transmission 139. Which of the two paths is used depends on whether the signal is to be transmitted in a first frequency band or in a second frequency band. How mixer block 86 upconverts is controlled by changing the frequency of the local oscillator signal TX LO generated by local oscillator 95 (also referred to as a frequency synthesizer) and by selecting the appropriate transmit path.

Figure 7:
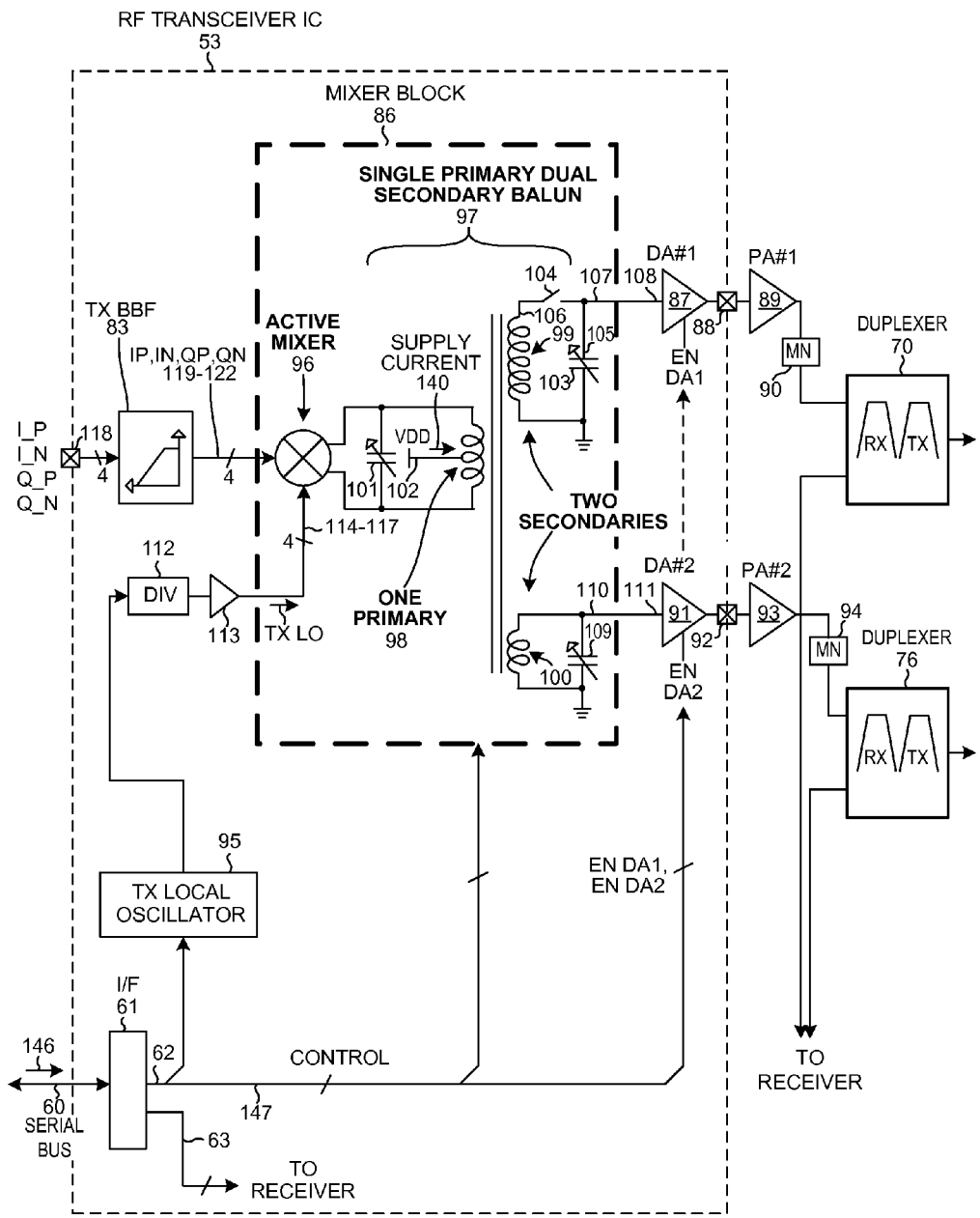
FIG. 7 is a more detailed diagram of certain parts of the RF transceiver integrated circuit of FIG. 6.

FIG. 7 is a more detailed diagram of certain parts of the RF transceiver integrated circuit 53 of FIG. 5. Mixer block 86 is a mixer/balun circuit that includes an active mixer 96 and a balun 97. The balun is referred to here as a "single primary dual secondary balun" because it includes only one primary winding 98 but includes a first secondary winding 99 and a second secondary winding 100. The balun converts the differential signal output of the mixer 96 into single-ended signals that drive the driver amplifiers 87 and 91. The primary winding 98 is electromagnetically coupled to the two secondary windings 99 and 100 so that the three windings together constitute a transformer. A first programmable variable capacitor 101 is coupled in parallel with primary winding 98 as illustrated. A center tap on primary winding 98 is coupled to a supply voltage conductor 102. When the mixer/balun circuit operates, a supply current 140 flows from the supply voltage conductor 102 and into the circuit via the center tap connection. A second programmable variable capacitor 103 is coupled in parallel with the first secondary winding 99. An N-channel field effect transistor switch 104 can be open or closed as explained in further detail below. If switch 104 is closed, then one lead 105 of capacitor 103 is coupled to a terminal 106 of the first secondary winding 99 such that the capacitor 103 is coupled in parallel with the first secondary winding 99. If switch 104 is open, then lead 105 of capacitor 103 is not coupled to terminal 106 and the capacitor 103 is not coupled in parallel with first secondary winding 99. Conductor 107 communicates a signal from the first secondary winding 99 to an input lead 108 of first driver amplifier 87. A third programmable variable capacitor 109 is coupled in parallel with the second secondary winding 100 as illustrated. Conductor 110 communicates a signal from the second secondary winding 100 to an input lead 111 of second driver amplifier 91.

Complex mutual inductance interactions between the three windings 98, 99 and 100 allow the primary winding to be tuned to resonate over an adequate tuning range (to resonate at the low band frequencies or at the mid band frequencies) without having to provide a large variable capacitor in parallel with the primary winding. When switch 104 is open and the circuit is operating at mid band frequencies there is no current flow in the first secondary winding 99 and impact of the first secondary winding 99 on primary winding resonance and overall balun resonance is reduced. The mutual inductance effect on primary winding resonance and overall balun resonance is largely due to the relatively smaller inductance of the second secondary winding 100. When switch 104 is closed and the circuit is operating at low band frequencies, the primary winding 98 and the first secondary winding 99 of larger inductance interact strongly whereas the second secondary winding 100 of smaller inductance has only a weak influence on primary resonance and overall balun resonance. The quality factor of the tuned balun for any frequency in the wideband frequency range from 824 MHz to 1980 MHz is 6.0 or greater.

Figure 4:
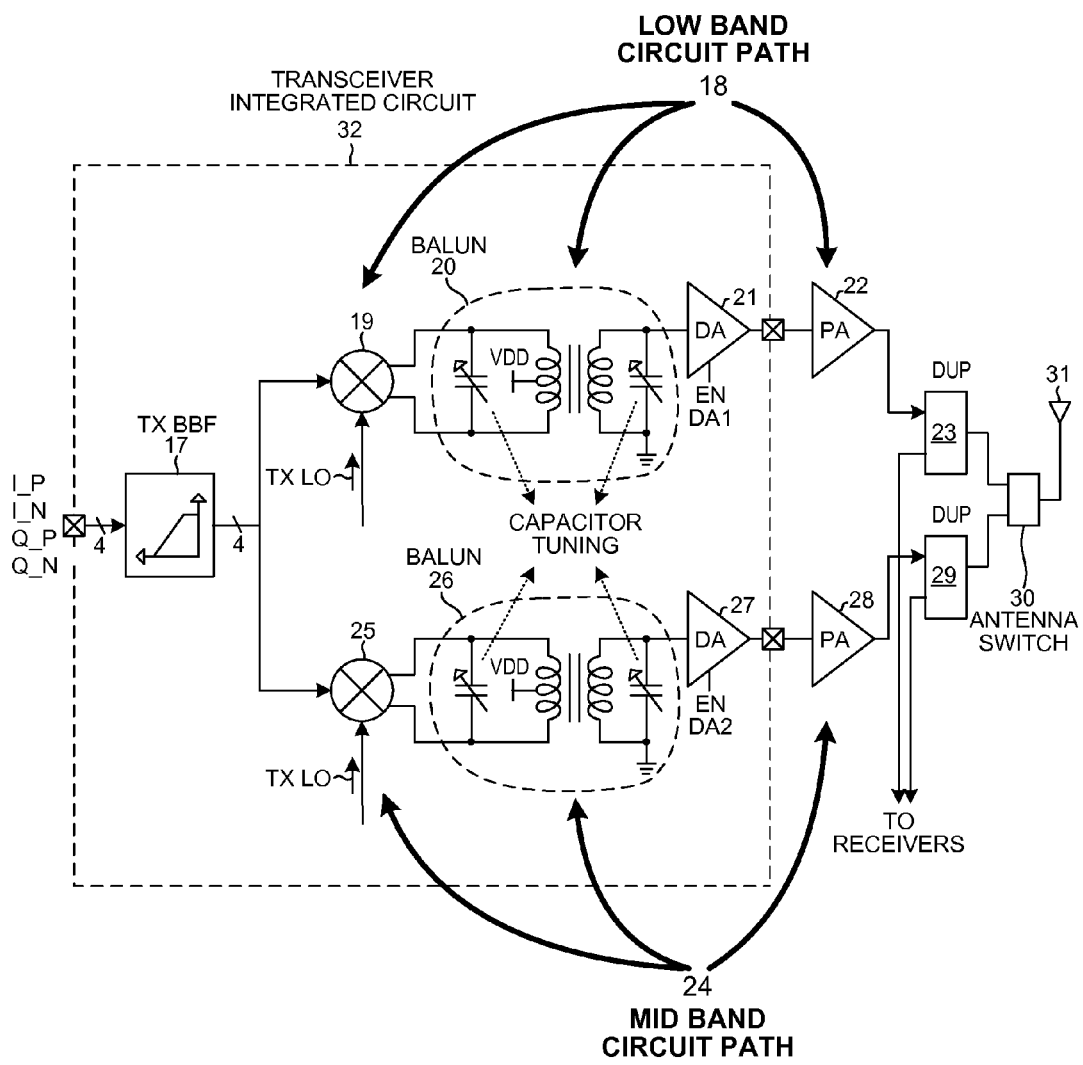
FIG. 4 (Prior Art) is a circuit diagram that illustrates a second way that a transmitter can be made to operate over the wideband frequency range of FIG. 1.

Although not shown in the simplified diagram of FIG. 6, a divider 112 and a buffer 113 are disposed in the signal path of the TX LO signal to the mixer 96. These circuits 112 and 113 are shown in FIG. 7 being located close to mixer 96 to indicate that these circuits are located closer to the mixer or mixers than are the corresponding circuits in the two-path conventional circuit of FIG. 4. The TX LO signal as output from buffer 113 actually involves two differential signals TX LO_I and TX LO_Q that are in quadrature relation to one another. In-phase local oscillator signal TX LO_I is communicated to mixer 96 via two conductors 114 and 115. Quadrature phase local oscillator signal TX LO_Q is communicated to mixer 96 via two conductors 116 and 117.

Reference numeral 118 represents four terminals of integrated circuit 53 through which two differential signals I_and Q_are received. I_P and I_N constitute the differential signal I. Q_P and Q_N constitute the differential signal Q. The transmit baseband filter 83 supplies two differential filtered signals via conductors 119-122 to active mixer 96. IP and IN constitute the first differential signal. QP and QN constitute the second differential signal. Digital control bits from serial bus interface 61 are communicated via some of the control conductors 62 to mixer block 86. These control conductors 147 are shown in further detail in FIG. 8.

Figure 8:
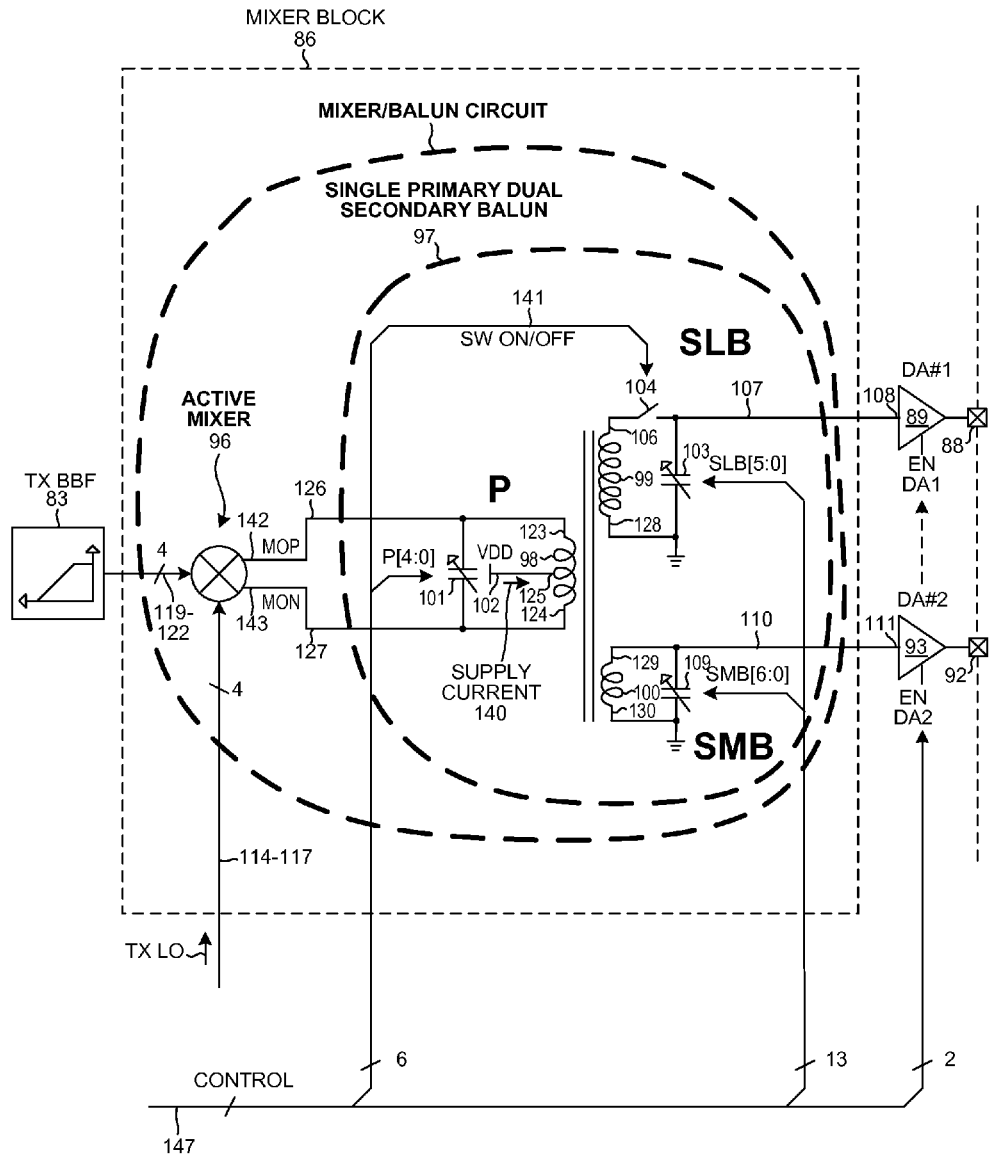
FIG. 8 is a circuit diagram that shows the single primary dual secondary balun of FIG. 7 in further detail.

FIG. 8 is a circuit diagram that shows the single primary dual secondary balun 97 in further detail. Reference numerals 123 and 124 identify terminals of primary winding 98. Reference numeral 125 identifies the center tap of primary winding 98. The differential mixer output signal MOP and MON from mixer 96 is supplied via a corresponding pair of conductors 126 and 127 to primary winding 98. Signal MOP is supplied from mixer output lead 142 onto terminal 123 of the primary winding. Signal MON is supplied from mixer output lead 143 onto terminal 124 of the primary winding. The capacitance of the first programmable variable capacitor 101 is controlled by the five-bit digital value P[4:0]. Reference numerals 106 and 128 identify terminals of first secondary winding 99. The capacitance of the second programmable variable capacitor 103 is controlled by the six-bit digital value SLB[5:0]. Signal SW ON/OFF is a single digital control bit on conductor 141 that controls switch 104. Reference numerals 129 and 130 identify terminals of the second secondary winding 100. The capacitance of the third programmable variable capacitor 109 is controlled by the seven-bit digital value SMB[6:0]. Reference numeral 147 identifies the control conductors that communicate the control values P[4:0], SW ON/OFF, SLB[5:0], SMB[6:0], EN DA1, and EN DA2. In operation, the digital baseband processor integrated circuit 54 sends digital information 146 (see FIG. 7) across serial bus 60 to RF transceiver integrated circuit 53. This digital information 146 is received onto RF transceiver integrated circuit 53 from the serial bus 60. The digital information 146 either contains or is used to generate the digital control values (P[4:0], SW ON/OFF, SLB[5:0], SMB[6:0], EN DA1, and EN DA2) that control the mixer/balun circuit and the driver amplifiers so that these circuits are properly configured to operate at the desired transmitting frequency.

Figure 9:
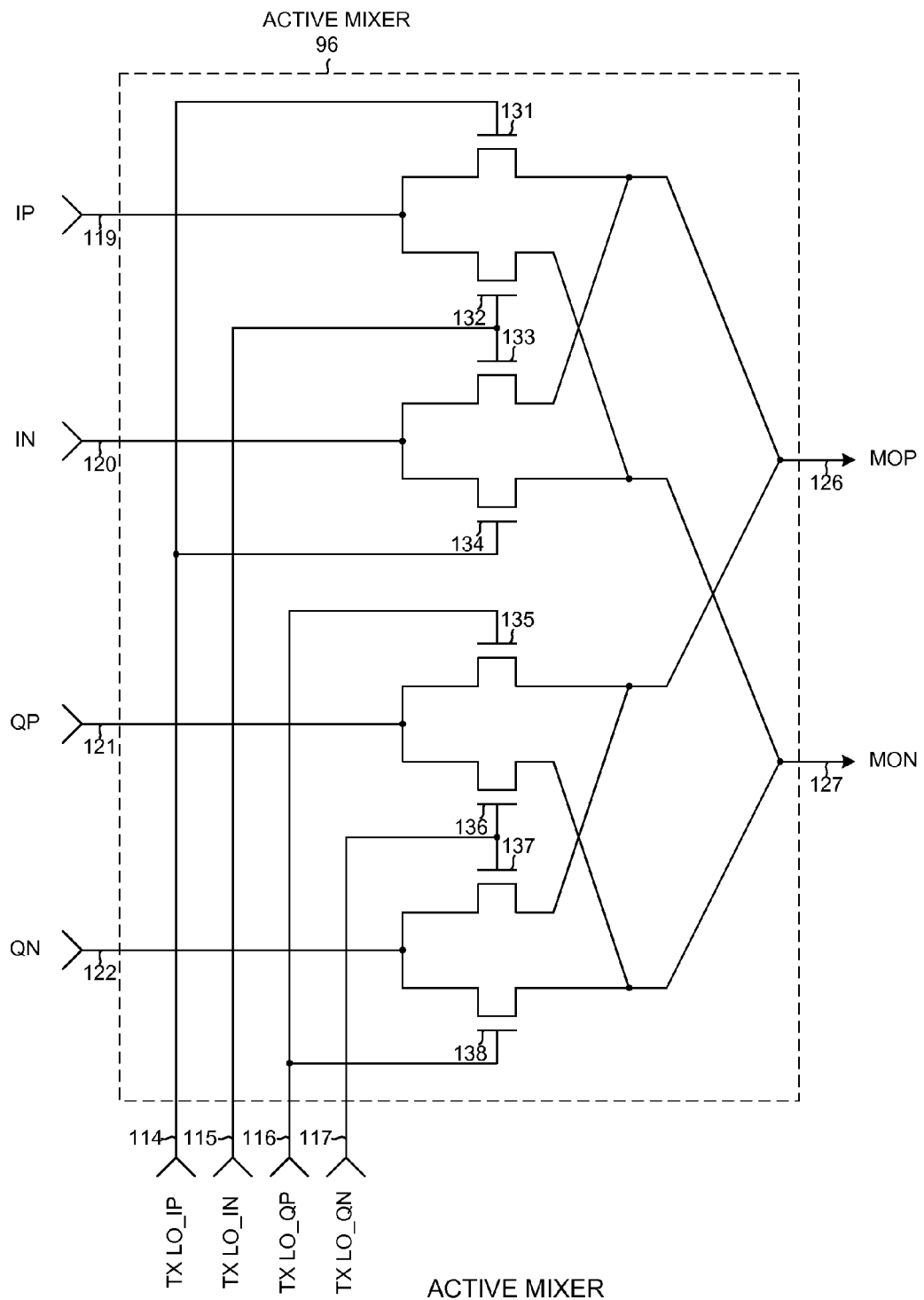
FIG. 9 is a more detailed diagram of the active mixer of FIG. 8.

FIG. 9 is a more detailed diagram of one example of active mixer 96. The signals TX LO_IP, TX LO_IN, TX LO_QP and TX LO_QN are current signals and together constitute the transmit local oscillator signal TX LO. Active mixer 96 includes eight N-channel field effect transistors 131-138 interconnected as illustrated.

FIG. 10 is a simplified top-down diagram of the layout of balun 97. The balun is realized principally in one layer of metallization on integrated circuit 53. Conductor crossovers in the balun are realized using inter-metal layer vias (not shown) and short bridging lengths of metal (not shown) in a second layer of metallization. The center tap 125 is realized using a via (not shown). Each of the programmable capacitors 101, 103 and 109 is realized as a bank of metal-oxide-metal RTMoM capacitors and associated transistor switches where the transistors are used to switch the capacitors in and out of the overall structure to increase or decrease the overall capacitance. The gates of the transistor switches receive the digital control value that sets the capacitance of the capacitor.

FIG. 11 is a table that sets forth various characteristics and parameters of the mixer/balun circuit including the inductances of the three windings 98, 99 and 100 and including the tuning ranges of the three programmable variable capacitors 101, 103 and 109.

FIG. 12 is a table that sets forth how the balun digital control values P[4:0], SLB[5:0], SMB[6:0], and SW ON/OFF are set depending on the frequency range in which transmitter 85 is operating. The mixer/balun circuit is operable over the entire wideband frequency range from 824 MHz to 1980 MHz even though the transmitter in this example is only made to operate in the low band (824 MHz to 915 MHz) and in the mid band (1710 MHz to 1980 MHz). In one advantageous aspect, the current consumption of the mixer/balun circuit is 20 mA or less at 1.3 volts of supply voltage (27 mW or less)

throughout this 824 MHz to 1980 MHz wideband frequency operating range while delivering at least 1.0 mW of signal power to the enabled driver amplifier. The ratio of power consumption to power supplied to the driver amplifier is therefore greater than 25/1. The supply current flowing into the mixer/balun circuit is the 1.3 volt supply current 140 (see FIG. 8) that flows from the supply voltage conductor 102 and into the center tap 125 of primary winding 98.

FIG. 13 is a graph that illustrates how the current consumption of the mixer/balun circuit and how the quality factor of the balun vary as the operating frequency of the mixer/balun circuit varies throughout the wideband frequency range 148 from the lower bound 144 of the wideband range at 824 MHz to the upper bound 145 of the wideband range at 1980 MHz. The current consumption of the mixer/balun circuit is below 20 mA throughout the wideband frequency range 148. The quality factor Q of the balun is above 6.0 throughout wideband frequency range 148.

FIG. 14 is a simplified flowchart of a method 200 in accordance with one novel aspect. A mixer in an RF transmitter is coupled (step 201) to a first driver amplifier and to a second driver amplifier using a wideband balun, where the wideband balun includes only one primary winding (coupled to the mixer) but includes a first secondary winding (coupled to an input of the first driver amplifier) and a second secondary winding (coupled to an input of the second driver amplifier).

FIG. 15 is a simplified flowchart of a method 300 in accordance with another novel aspect. Digital information is received (step 301) via a serial bus onto an integrated circuit. In one example, the digital information is information 146 and the serial bus is serial bus 60 and the integrated circuit is RF transceiver integrated circuit 53. This digital information is then used (step 302) on-chip to control a single primary dual secondary balun circuit. In one example, the digital information includes or is decoded to include first digital control information, second digital control information, and third digital control information, where the first digital control information sets a capacitance of a first capacitor 101 in parallel with the single primary winding 98 of the balun, where the second digital control information sets a capacitance of a second capacitor 99 in parallel with the first secondary winding 99 of the balun, and where the third digital control information sets a capacitance of a third capacitor 109 in parallel with the second secondary winding 100 of the balun.

Although certain specific embodiments are described above for instructional purposes, the teachings of this patent document have general applicability and are not limited to the specific embodiments described above. In some embodiments, more than two pairs of tuned secondary windings and driver amplifiers are coupled to a single tuned primary winding. In some embodiments, the two secondary windings are actually two parts of a tapped secondary where one terminal end of the secondary winding is grounded, where the tap is coupled to the input of a first driver amplifier, and where the other terminal end of the secondary winding is coupled to the input of a second driver amplifier. In some embodiments a switch is provided to detune each of the secondary winding/capacitors rather than just the first secondary winding/capacitor for the low band as set forth above. Multiple suitable different layout structures of the balun transformer are possible. The post-balun amplification need not be performed in two stages using an on-chip driver amplifier and a separate external power amplifier, but rather in some embodiments the post-balun amplification is performed in one stage using only a single amplifier. Accordingly, various modifications, adaptations, and combinations of the various features of the described specific embodiments can be practiced without departing from the scope of the claims that are set forth below.

What is claimed is:

1. An apparatus comprising:
a mixer having a first output lead and a second output lead, wherein the mixer is configured to generate a differential signal based on a first In-phase (I) differential signal and a first Quadrature phase (Q) differential signal received from a local oscillator; and
a balun responsive to the differential signal, the balun comprising:
a primary winding having a first terminal coupled to the first output lead of the mixer and a second terminal coupled to the second output lead of the mixer;
a first capacitor coupled in parallel with the primary winding;
a first secondary winding;
a second capacitor selectively couplable in parallel with the first secondary winding;
a second secondary winding;
a third capacitor coupled in parallel with the second secondary winding; and
a switch configured to selectively couple a first terminal of the first secondary winding to a first terminal of the second capacitor.

2. The apparatus of claim 1, wherein the mixer is further configured to output a differential signal to the primary winding of the balun.

3. The apparatus of claim 1, wherein the mixer is further configured to receive a second In-phase(I) differential signal and a second Quadrature phase (Q) differential signal from a baseband filter.

4. The apparatus of claim 1, wherein the balun is included in a layer of metallization on an integrated circuit.

5. The apparatus of claim 4, wherein the layer of metallization comprises a single layer.

6. The apparatus of claim 4, wherein the second secondary winding is located within the primary winding, and wherein the first secondary winding overlaps the primary winding.

7. The apparatus of claim 4, wherein the second secondary winding is located within the primary winding, and wherein the first secondary winding intertwines with the primary winding.

8. The apparatus of claim 1, further comprising:
a first drive amplifier including a first input coupled to the first terminal of the first secondary winding; and
a second drive amplifier including a second input coupled to a first terminal of the second secondary winding.

9. The apparatus of claim 1, wherein the mixer comprises a single mixer.

10. The apparatus of claim 1, wherein the switch is further configured to selectively couple the first terminal of the first secondary winding to the first terminal of the second capacitor based on a control bit.

11. A circuit comprising:
a mixer having a first output lead and a second output lead;
a balun comprising:
a primary winding having a first terminal coupled to the first output lead of the mixer and a second terminal coupled to the second output lead of the mixer;
a first capacitor coupled in parallel with the primary winding;
a first secondary winding;
a second capacitor selectively couplable in parallel with the first secondary winding;
a second secondary winding;

a third capacitor coupled in parallel with the second secondary winding; and a switch that is configured to selectively couple a first terminal of the first secondary winding to a first terminal of the second capacitor;

wherein the mixer receives a first In-phase (I) differential signal and a first Quadrature phase (Q) differential signal from a baseband filter, wherein the mixer receives a second In-phase (I) differential signal and a second Quadrature phase (Q) differential signal from a local oscillator, and wherein the mixer outputs a mixer output differential signal to the primary winding of the balun.

12. The circuit of claim 11, wherein the primary winding includes a tap, and wherein the tap is coupled to a supply voltage conductor.

13. The circuit of claim 11, wherein each of the first, second and third capacitors includes a digitally programmable variable capacitor.

14. The circuit of claim 11, wherein the first terminal of the second capacitor is coupled to an input lead of a first driver amplifier, and wherein a terminal of the third capacitor is coupled to an input lead of a second driver amplifier.

15. The circuit of claim 11, wherein the circuit is operable over a frequency range including an upper bound at an upper frequency and a lower bound at a lower frequency, wherein the upper frequency is at least twice the lower frequency, and wherein the balun includes a quality factor (Q) of at least six over the frequency range.

16. The circuit of claim 11, wherein the circuit is operable over a frequency range including an upper bound at an upper frequency and a lower bound at a lower frequency, wherein the upper frequency is at least twice the lower frequency, and wherein the balun is configured to provide at least one milliwatt of signal power to a selected one of two driver amplifiers while consuming less than approximately twenty-seven milliwatts at any frequency in the frequency range.

17. The circuit of claim 11, wherein the circuit is integrated in an integrated circuit.

18. The circuit of claim 11, wherein when the switch is in a first position the second capacitor is coupled in parallel with the first secondary winding, and wherein when the switch is in a second position the second capacitor is not coupled in parallel with the first secondary winding.

19. The circuit of claim 11, wherein the primary winding includes a first inductance, wherein the first secondary winding includes a second inductance, wherein the second secondary winding includes a third inductance, wherein the second inductance is more than approximately twice as large as the first inductance and is more than approximately twice as large as the third inductance.

20. An integrated circuit comprising:
a mixer;
a first driver amplifier;
a second driver amplifier; and
a balun having a single primary winding, a first secondary winding, and a second secondary winding, wherein the single primary winding is coupled to receive a first signal from the mixer, wherein the first secondary winding is coupled to supply a second signal to the first driver amplifier, wherein the second secondary winding is coupled to supply a third signal to the second driver amplifier, and wherein the mixer, the first driver amplifier, the second driver amplifier, and the balun are included in a transmitter, wherein the mixer receives a first In-phase (I) differential signal and a first Quadrature phase (Q) differential signal from a baseband filter, wherein the mixer receives a second In-phase (I) differential signal and a second Quadrature phase (Q) differential signal from a local oscillator, and wherein the mixer outputs a mixer output differential signal to the primary winding of the balun.

21. The integrated circuit of claim 20, wherein the balun further includes a first capacitor coupled in parallel with the primary winding, wherein the balun further includes a second capacitor that is programmably couplable in parallel with the first secondary winding, and wherein the balun further includes a third capacitor that is coupled in parallel with the second secondary winding.

22. The integrated circuit of claim 20, wherein the mixer and the balun are operable over a frequency range that includes an upper bound at an upper frequency and that includes a lower bound at a lower frequency, wherein the upper frequency is at least twice the lower frequency, and wherein the balun has a quality factor (Q) of at least six over the frequency range.

23. The integrated circuit of claim 20, wherein the mixer and the balun are operable over a frequency range that includes an upper bound at an upper frequency and that includes a lower bound at a lower frequency, wherein the upper frequency is at least twice the lower frequency, and wherein the mixer and the balun can deliver at least one milliwatt of power to a selected one of two driver amplifiers while consuming less than approximately twenty-seven milliwatts at any frequency in the frequency range.

24. The integrated circuit of claim 20, wherein the transmitter is a radio frequency (RF) transmitter operable over the frequency range.

25. A method comprising:
receiving a first output signal of a mixer and a second output signal of the mixer at a balun, wherein the first output signal and the second output signal are generated by the mixer based on a first In-phase (I) differential signal and a first Quadrature phase (Q) differential signal from a local oscillator, the balun comprising:
a primary winding having a first terminal coupled to a first output of the mixer and a second terminal coupled to a second output of the mixer;
a first secondary winding;
a second secondary winding; and
a switch configured to selectively couple a first terminal of the first secondary winding to a first terminal of a first capacitor, wherein the first capacitor is in parallel with the first secondary winding; and
selecting an output signal of the balun by selecting one of the first secondary winding and the second secondary winding.

26. The method of claim 25, further comprising:
controlling the switch to couple the first terminal of the first secondary winding to the first terminal of the first capacitor; and
selecting a first output signal of the balun from the first secondary winding, wherein the first output signal of the balun is within a first frequency band.

27. The method of claim 26, further comprising:
controlling the switch to decouple the first terminal of the first secondary winding from the first terminal of the first capacitor; and
selecting a second output signal of the balun from the second secondary winding, wherein the second output signal of the balun is within a second frequency band, wherein the first frequency band is different from the second frequency band.

28. The method of claim 25, wherein the first output signal and the second output signal are generated by the mixer further based on a second In phase (I) differential signal and a second Quadrature phase (Q) differential signal received at the mixer from a baseband filter.

29. The method of claim 25, wherein the balun further comprises a first drive amplifier coupled to the first terminal of the first secondary winding and a second drive amplifier coupled to a first terminal of the second secondary winding, and wherein the first output signal and the second output signal comprise a differential signal.

30. The method of claim 25, further comprising:
receiving a plurality of digital bits; and
tuning the balun based on the plurality of digital bits.

31. The method of claim 25, wherein the primary winding includes a tap that is coupled to a voltage supply conductor, wherein a first terminal of the first secondary winding is coupled to an input of a first amplifier, and wherein a first terminal of the second secondary winding is coupled to an input of a second amplifier.

32. An apparatus comprising:
means for combining a set of input signals to produce a mixed output signal;
means for transforming the mixed output signal to produce a first output signal and a second output signal, the means for transforming comprising:
a primary inductor having a first terminal coupled to a first output of the means for combining and a second terminal coupled to a second output of the means for combining, wherein the first output of the means for combining and the second output of the means for combining are generated based on an In-phase (I) differential signal and a Quadrature phase (Q) differential signal received from a local oscillator;
a first secondary inductor; and
a second secondary inductor;
means for switching, the means for switching configured to selectively couple a first terminal of the first secondary inductor to a first terminal of a first capacitor; and
means for controlling the means for switching to select one of the first output signal or the second output signal.

33. The apparatus of claim 32, wherein the means for switching is controllable to select the first output signal by coupling the first terminal of the first secondary inductor to the first terminal of the first capacitor, and wherein the means for switching is controllable to select the second output signal by decoupling the first terminal of the first secondary inductor from the first terminal of the first capacitor.

34. The apparatus of claim 32, further comprising first means for amplifying that is selectively coupled to the first terminal of the first secondary inductor and second means for amplifying coupled to a first terminal of the second secondary inductor.

35. The apparatus of claim 32, wherein the mixed output signal comprises a differential signal, wherein the first output signal comprises a first single-ended signal, and wherein the second output signal comprises a second single-ended signal.

* * * * *